United States Statutory Invention Registration [19]

[11] Reg. Number: H842

Ochs [43] Published: Nov. 6, 1990

[54] METAL CONDUCTOR STRUCTURE HAVING LOW ELECTRO-MIGRATION AT HIGH CURRENTS FOR SEMICONDUCTOR DEVICES

[75] Inventor: Christopher D. Ochs, Emmaus, Pa.

[73] Assignee: American Telephone And Telegraph Company, New York, N.Y.

[21] Appl. No.: 374,116

[22] Filed: Jun. 30, 1989

[51] Int. Cl.[5] ..... H01L 23/48
[52] U.S. Cl. ..... 357/68
[58] Field of Search ..... 357/68, 65

[56] References Cited

U.S. PATENT DOCUMENTS

| | | | |
|---|---|---|---|
| 4,371,890 | 2/1983 | Anagnostopoulos et al. | 357/68 |
| 4,583,111 | 4/1986 | Early . | |
| 4,590,327 | 5/1986 | Nath et al. | 357/68 |
| 4,818,335 | 4/1989 | Karnett | 357/68 |

FOREIGN PATENT DOCUMENTS

| | | | |
|---|---|---|---|
| 52-036470 | 3/1977 | Japan | 357/68 |
| 54-141566 | 11/1979 | Japan | 357/68 |
| 58-147062 | 9/1983 | Japan | 357/68 |
| 60-211863 | 10/1985 | Japan | 357/68 |
| 61-075565 | 4/1986 | Japan | 357/41 |

OTHER PUBLICATIONS

Braen, IBM Bulletin-Power Distr. for LSID, Dec. 1973 vol. 16 No. 7 p. 2308.

Layout Plot Of An Exemplary High-Current Capacity MOS Transistor Of The Prior Art From A Proprietary CMOS IC.

*Primary Examiner*—Thomas H. Tarcza
*Assistant Examiner*—Linda J. Wallace
*Attorney, Agent, or Firm*—Scott W. McLellan

[57] ABSTRACT

A technique for providing high current carrying metal conductors for coupling to transistors or the like to increase the current carrying capacity of the transistor without substantial increase in size. The conductors are tapered along the axis of current flow with current being conducted to or from the tapered portion of the conductors, such that the current density therein is substantially constant.

3 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METAL CONDUCTOR STRUCTURE HAVING LOW ELECTRO-MIGRATION AT HIGH CURRENTS FOR SEMICONDUCTOR DEVICES

BACKGROUND OF THE INVENTION

1. Field of the Invention

This invention relates to integrated circuits in general and, more particularly, to metal conductors on integrated circuits.

2. Description of the Prior Art

Very large scale integrated circuits, such as microprocessors, have logic circuitry (buffers) which drive external logic circuits, such as buffers for driving an address or data bus. Compared to the logic circuit which are internal to the microprocessor, the buffers supply relatively large output currents to drive the external logic circuits. Hence, the transistors in the buffers are designed to handle more current than their counterparts in the internal logic circuitry.

A consequence of using high currents in an integrated circuit (IC) with metal conductors is electro-migration of the metal. Aluminum conductors (or aluminum alloyed with copper) suffer from electro-migration when the current density in the conductor exceeds a predetermined maximum amount. Electro-migration can lead to premature failure of the IC unless proper care is taken to ensure that the current density in any one conductor does not exceed the predetermined maximum. To keep the current density below the predetermined maximum, the metal conductors, within and coupling from the buffers, are therefore larger (wider) than the metal conductors interconnecting the internal logic circuitry.

For the buffer to achieve the larger current carrying capacity, a common approach utilizes multiple parallel transistors therein, each transistor being similar in size to other transistors in the IC. Each transistor, via relatively thin metal conductors, couples to a relatively wide metal conductor designed to carry the larger current. This approach suffers from wasting large amounts of area on the IC for the buffers due to the relative area inefficiency of the wide metal conductors coupling to the parallel transistors.

Still another common approach utilizes one or more relatively large transistors in parallel with the relatively wide metal conductor coupling directly to each transistor. The width of the metal conductor is chosen to minimize the electro-migration of the conductor under a maximum design current flow. As with the multiple transistor approach, above, this approach suffers from wasting large amounts of area on the IC for the buffers due to the inefficient use of the wide metal conductors to couple to the relatively large transistors.

It is noted that the cost of having larger than necessary buffers, of which there can be hundreds in a particular IC, is the reduced area available on the IC for other logic circuits. This constraint can detrimentally impact the functions or features desired from the IC.

SUMMARY OF THE INVENTION

It has been found that by tapering metal conductors on the IC along with means to conduct current to or from the metal conductor along the tapered portion thereof so as to have a substantially constant current density therein, large currents can be handled by those conductors with minimum area and without suffering from electro-migration effects. This technique can be applied to transistors, diodes or other similar devices, so that the devices can carry relatively large currents without the need for paralleling the devices. This aspect of the invention reduces the amount of area required on the IC for a device with a given current carrying capacity.

However, should extremely high current capacity be desired, the invention can be applied to parallel transistors in such a way to result in a very area efficient design.

Further, the invention may be viewed as a method of fabricating high current carrying metal conductors on an IC by tapering the conductors along the axis of current flow, along with conducting current to or from the conductor along the axis, such that the current density therein is substantially constant along the axis.

BRIEF DESCRIPTION OF THE DRAWING

The foregoing features of this invention, as well as the invention itself, may be more fully understood from the following detailed description of the drawings, in which.

DETAILED DESCRIPTION

By tapering metal conductors, such as the widths thereof, on an integrated circuit such that the current density therein is substantially constant by conducting current to or from the conductor along the tapered portion thereof, yet less than a predetermined maximum, high density, high current capacity semiconductor devices can be achieved. This aspect of the invention allows, for example, a single transistor to carry large currents without suffering from the electro-migration of the metal conductors coupling thereto. Electro-migration is not a problem so long as the current density is less than the predetermined maximum, which is the maximum allowed for the type of metal used for the conductor to minimize the electro-migration thereof. For aluminum or aluminum alloyed with copper (typically 5% copper), the maximum current density is an exemplary $10^5$ A $cm^{-2}$. Other metals, however, also experience electro-migration and are, therefore, within the scope of the invention.

It has been discovered that the maximum current density in a metal conductor is greater where the conductor covers "smooth" features on the IC rather than "rough" features. An exemplary "rough" feature is a contact window in which the metal conductor contacts a different layer of metal or an underlaying semiconductor surface, such as contacting a source or drain semiconductor region of a metal-oxide-semiconductor field-effect transistor (MOSFET). Hence, the conductors should be disposed in such a way that the minimum number of "rough" features are beneath the conductors.

EXEMPLARY EMBODIMENTS

Figure 1:
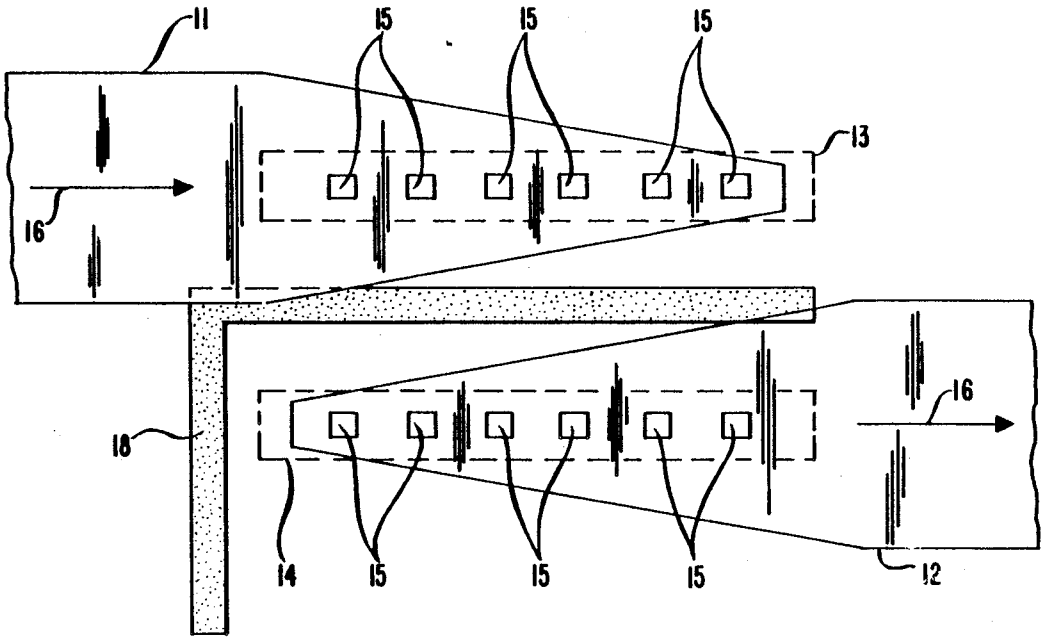
FIG. 1 is an exemplary high current capacity MOSFET embodying the invention in a first level of metal; and, FIG. 2 is an exemplary multiple high current transistors paralleled and embodying the invention in both a first and a second level of metal.

In FIG. 1, an exemplary MOSFET 10 (not to scale) is shown utilizing metal conductors 11, 12 tapered along the widths thereof to conduct current to and from the drain 13 and source 14 regions of MOSFET 10. Drain 13 and source 14 regions are conventional diffusions or replants into a semiconductor layer (not shown) and are shown for illustrative purposes only. Contacts 15, such as vias, couple the conductors 11, 12 to the corresponding drain 13 and source 14 regions. Arrow 16 shows the relative direction of current in the conductors. Conductor 18, typically polysilicon, forms the gate electrode of the MOSFET 10. As shown, the amount of currents carried by each contact 15 is substantially the same, allowing for the uniform spacing of the contacts along the tapered metal conductors 11, 12. Hence, the amount of current removed from conductor 11 (and, similarly, added to conductor 12) is substantially uniform at each contact.

As shown, the width of the conductors 11, 12 is tapered along the elongated axis of the conductor so as to form a trapezoidal shape; the widest portion of the taper occurs where the current is the heaviest. Assuming that each contact 15 carries substantially equal current, then the cross-sectional area of the conductor 11, 12 immediately adjacent to a given contact 15 must increase proportionally. For example, each conductor 11, 12 is shown with six contacts. If the width of the conductor 11 at the contact 15 nearest the narrowest portion of the taper is X, then the widest width of the conductor 11 is approximately six times X, assuming uniform thickness of the conductor. Similarly, conductor 12 varies in width along the contacts 15 corresponding thereto. Hence, the current densities in the conductors 11, 12 are substantially constant along the length of the conductors 11, 12. This design has allowed MOSFETs to carry more than three times the current without an increase in area, compared to MOSFET designs of the prior art.

In FIG. 1, the contacts 15 are disposed along the center of the conductors 11, 12 and are regularly spaced. It is understood, however, that the current conducted by each contact 15 need not be substantially the same nor in the center of the corresponding conductors 11, 12. Should the current conducted by each contact 15 be substantially different, a different taper would be necessary to achieve the substantially constant current density requirement, such as an logarithmic taper. Further, the taper need not be regular (symmetric) if the contacts 15 are not along the center axis of the corresponding conductors 11, 12.

It is also understood that the edges of the taper as shown in FIG. 1 are smooth. But because of lithographic restrictions due to the processing equipment used to manufacture ICs, the taper may be composed of rectangles of varying widths and lengths to approximate the desired taper.

Figure 2:
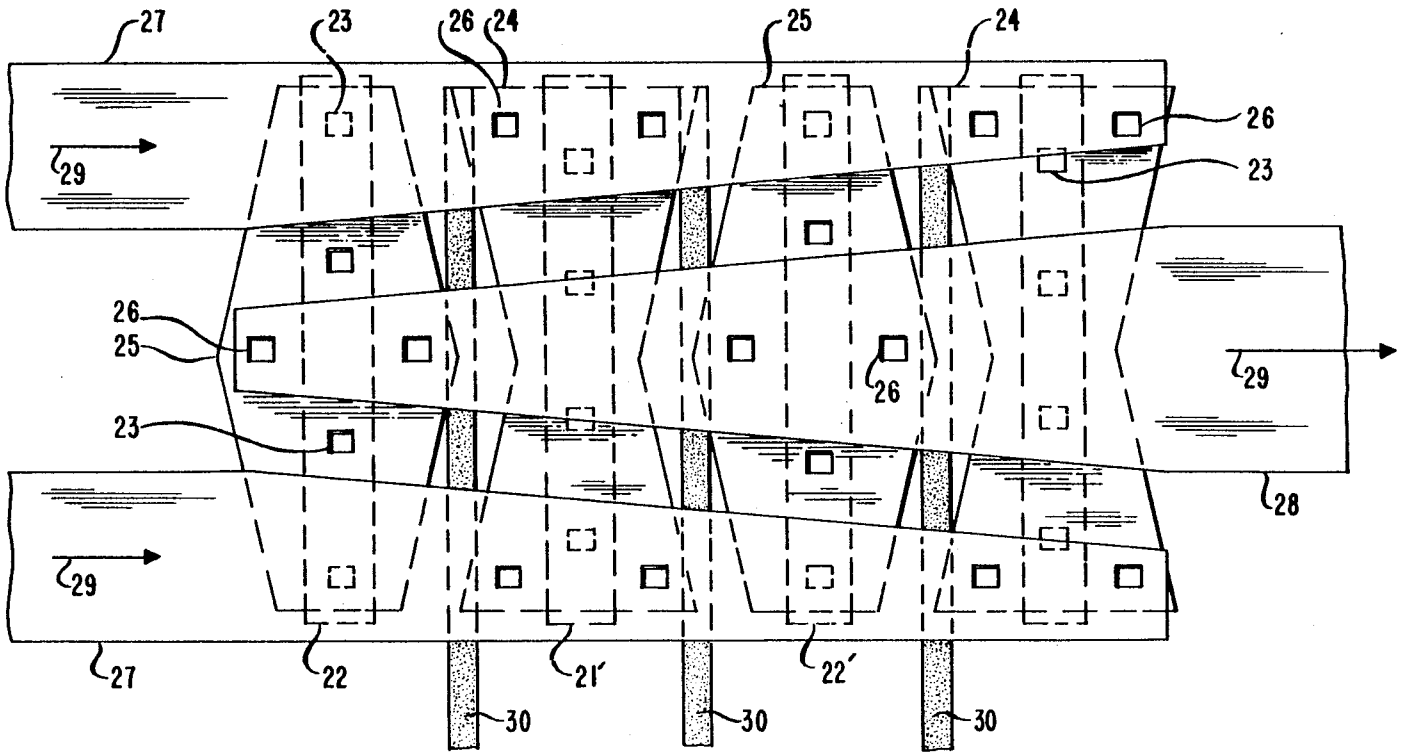

In FIG. 2 (not to scale), an exemplary structure of paralleled MOSFETs 20 are shown with drain 21,21' regions and source 22,22' regions, regions 21' and 22' being shared. Contacts 23 couple regions 21,21',22,22' to corresponding metal conductors 24, 25, similar to that shown in FIG. 1. The widths of conductors 24,25 are tapered to have substantially constant current density therein and are, as shown here, disposed in the first level of metal above the semiconductor substrate (not shown). Conductors 24, 25 are correspondingly interconnected via contacts 26 to conductors 27, 28, shown here disposed in the second layer of metal above the semiconductor substrate (not shown). It is noted that the two conductors 27 may be merged into one conductor (not shown) for convenience. Current flow in conductors 27, 28 is shown by arrows 29. As shown, the conductors 27, 28 are tapered along the direction of current flow such that the current density therein is also substantially constant, as described above in connection with FIG. 1. Conductors 30, typically polysilicon, form the gate electrodes for the MOSFET 20.

The above described concepts and implementations of the MOSFET 10 of FIG. 1 are also applicable to the structure shown in FIG. 2 and may be applied in either layer of metal.

It is noted that although the examples given here are for MOSFETs, this technique can also be applied to bipolar transistors, diodes, diffused resistors, etc., or wherever a single conductor supplies high current to a plurality of loads along the length of the conductor.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

I claim:

1. An integrated circuit having at least one metal conductor and at least one MOSFET, the MOSFET having a drain region and a source region, characterized by:

multiple contacts, coupled to the metal conductor along a major axis thereof, for conducting current to or from the metal conductor and the drain or source regions; and, the metal conductor being tapered along the major axis thereof;

wherein the current density in the metal conductor is substantially constant along the major axis.

2. The integrated circuit as recited in claim 1, wherein the metal conductor is tapered into the shape of a trapezoid.

3. The integrated circuit as recited in claim 2, wherein the MOSFET has both the source and drain regions coupling to corresponding tapered metal conductors.

* * * * *